US007511392B2

(12) United States Patent
Rubbo et al.

(10) Patent No.: US 7,511,392 B2
(45) Date of Patent: Mar. 31, 2009

(54) ROTATING RECTIFIER MODULE

(75) Inventors: Michael Rubbo, Muskego, WI (US);
Richard Wainwright, Grand Rapids, MI (US); Edgar Calago, Lake Villa, IL (US); Bruce Wallen, Waterford, WI (US)

(73) Assignee: Hamilton Sundstrand Corporation, Rockford, IL (US)

( * ) Notice: Subject to any disclaimer, the term of this patent is extended or adjusted under 35 U.S.C. 154(b) by 344 days.

(21) Appl. No.: 11/155,384

(22) Filed: Jun. 17, 2005

(65) Prior Publication Data
US 2006/0284499 A1    Dec. 21, 2006

(51) Int. Cl.
*H02K 11/00* (2006.01)
(52) U.S. Cl. .................... 310/68 D; 310/71
(58) Field of Classification Search ........... 310/68 D, 310/71, 59
See application file for complete search history.

(56) References Cited

U.S. PATENT DOCUMENTS

| 3,829,725 | A |   | 8/1974  | Petersen et al. |         |
|-----------|---|---|---------|-----------------|---------|
| 4,570,094 | A |   | 2/1986  | Trommer         |         |
| 4,603,344 | A |   | 7/1986  | Trommer         |         |
| 4,628,219 | A |   | 12/1986 | Troscinski      |         |
| 5,065,484 | A |   | 11/1991 | Pinchott        |         |
| 5,166,564 | A |   | 11/1992 | Shahamat et al. |         |
| 5,365,133 | A | * | 11/1994 | Raad            | 310/68 D |
| 5,587,616 | A | * | 12/1996 | Johnsen         | 310/68 D |
| 5,737,210 | A |   | 4/1998  | Barahia         |         |
| 5,773,903 | A | * | 6/1998  | McCabria et al. | 310/68 D |
| 5,796,196 | A |   | 8/1998  | Johnsen et al.  |         |
| 5,939,807 | A | * | 8/1999  | Patyk et al.    | 310/89 |
| 6,538,352 | B2 |  | 3/2003  | Asao            |         |
| 6,661,135 | B2 | * | 12/2003 | Borden et al.   | 310/68 D |
| 6,666,578 | B2 |  | 12/2003 | Gibbs et al.    |         |
| 6,762,512 | B2 |  | 7/2004  | Nelson          |         |
| 6,828,703 | B2 |  | 12/2004 | Einheuser et al.|         |
| 6,859,019 | B2 |  | 2/2005  | Tornquist et al.|         |
| 6,879,083 | B2 |  | 4/2005  | Doherty et al.  |         |
| 6,903,470 | B2 | * | 6/2005  | Doherty et al.  | 310/59 |
| 2003/0042810 | A1 | | 3/2003 | Tomquist et al. |         |
| 2007/0108854 | A1 | * | 5/2007 | Osborn et al.   | 310/68 D |

FOREIGN PATENT DOCUMENTS

CH    449 758    1/1968
GB    1588567    4/1981

* cited by examiner

*Primary Examiner*—Dang D Le
(74) *Attorney, Agent, or Firm*—Kinney & Lange, P.A.

(57) ABSTRACT

A rotating rectifier module for rectifying a multiphase alternating current signal provided by a multiphase alternating current power supply includes a housing, a circuit board, a plurality of input terminals, a first output terminal, a second output terminal, and a plurality of rectifier circuits. The housing has an outer surface, an inner surface defining a central opening for receipt of a rotatable shaft, and at least one cavity located between the outer and inner surfaces. The circuit board is mounted in a plane substantially normal to the outer surface. The input terminals are located on the circuit board. Each input terminal provides for electrical connection to one phase of the power supply. The first and second output terminals are located on the circuit board for electrical connection to a direct current load. The rectifier circuits are electrically connected in parallel between the first and second output terminals. Each rectifier circuit is mounted inside one of the at least one cavity on an outermost surface that defines the cavity and is electrically connected to one of the input terminals.

12 Claims, 8 Drawing Sheets

ROTATING RECTIFIER MODULE

BACKGROUND OF THE INVENTION

The present invention relates generally to the field of dynamoelectric machines, and more particularly, to an improved rotating rectifier module for use therein.

A rotating rectifier assembly is an electronic device for rectifying alternating current into direct current on rotating elements of electrical machinery. A common application of the rotating rectifier assembly is in a brushless generator.

A typical brushless generator includes an exciter and a main generator for converting the rotational energy generated by a prime mover into a multiphase alternating current (AC) power. The exciter may include stationary field windings, which when electrically coupled to receive a direct current (DC) voltage from a DC voltage source, such as a voltage regulator, voltage control device, or battery, will develop a magnetic field. The exciter may also include windings mounted on the generator rotor, which rotate within this magnetic field. During rotation, alternating current is induced in the exciter rotor windings. Typically, the exciter rotor windings are wound such that the induced alternating current is a three-phase alternating current. Rectifier circuits then rectify a three-phase AC voltage from the exciter rotor windings into a DC current output for supply to the main generator.

Because these rectifier circuits are electrically coupled between two sets of windings both mounted on the generator rotor, the rectifier circuits are likewise carried by the generator rotor—thus the term "rotating rectifier circuits." Traditional rotating circuits include mass heavy electronic components radially mounted in a plane normal to the shaft axis. These components are caused to rotate with the shaft and are mechanically and thermally weakened by the centripetal stresses caused by this rotation.

A second problem with traditional rotating rectifier circuits is that they are not designed to be balanced in weight in the plane normal to the shaft axis. This imbalance results in eccentricities that contribute to limiting speeds of the rotating equipment to which they are applied.

Traditional rotating rectifier circuits are assembled by hand while the rotating equipment to which they are applied is also assembled. To simplify this hand assembly process, "flying leads" are used to connect the rotating rectifier circuits to the rotor windings of the exciter and the main generator. These flying leads are subject to poor electrical contact from handling and suffer from rotational stresses.

The semiconductor devices used in the rectifiers dissipate power in the form of heat during their use. Without proper attention to cooling, the semiconductor devices will fail. However, traditional rotating rectifiers lack adequate mounting surface and heat sink area to be utilized in high temperature applications.

Accordingly, a need exists for a rotating rectifier assembly that overcomes these problems with prior art designs.

BRIEF SUMMARY OF THE INVENTION

A rotating rectifier module for rectifying a multiphase alternating current signal provided by a multiphase alternating current power supply includes a housing, a circuit board, a plurality of input terminals, a first output terminal, a second output terminal, and a plurality of rectifier circuits. The housing has an outer surface, an inner surface defining a central opening for receipt of a rotatable shaft, and at least one cavity located between the outer and inner surfaces. Each cavity is defined in the housing by at least an outermost and an innermost surface. The circuit board is mounted in a plane substantially normal to an axis of rotation of the rotating rectifier module. The input terminals are located on the circuit board. Each input terminal provides for electrical connection to one phase of the power supply. The first and second output terminals are located on the circuit board for electrical connection to a direct current load. The rectifier circuits are electrically connected in parallel between the first and second output terminals. Each rectifier circuit is mounted inside one of the at least one cavity on an outermost surface that defines the cavity and is electrically connected to one of the input terminals.

DETAILED DESCRIPTION

Figure 1:
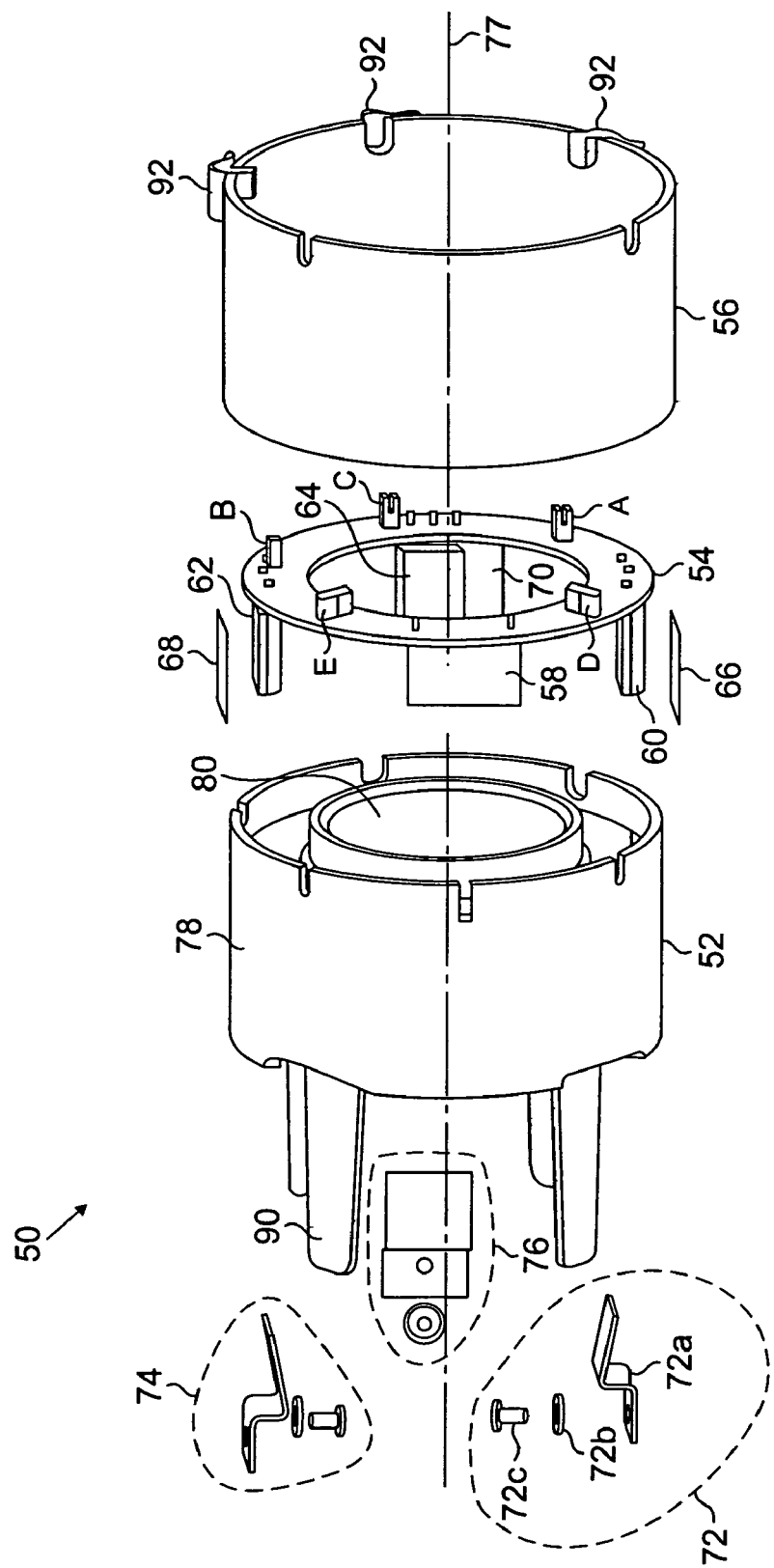
FIG. 1 is an exploded perspective view of a rotating rectifier module in accord with the present invention.
Figure 2:
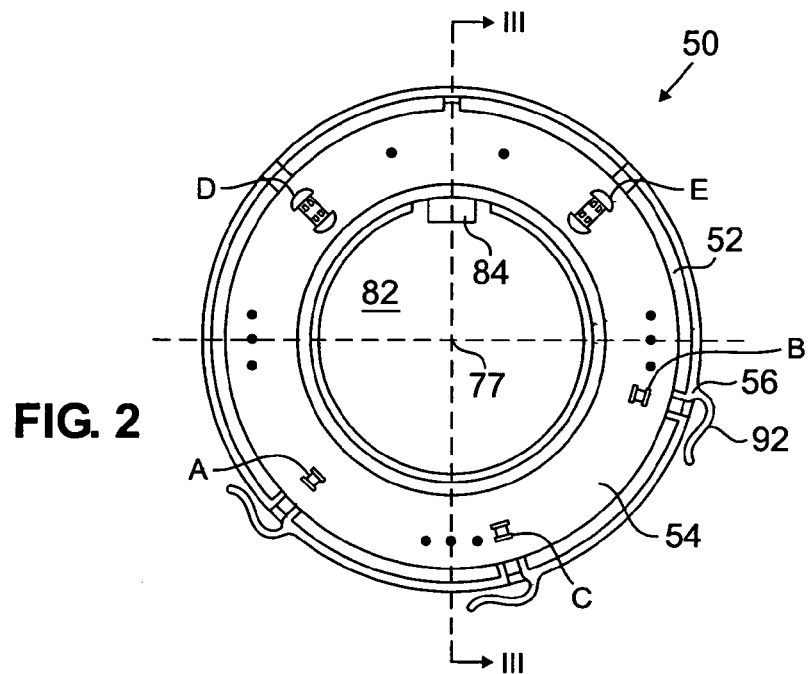
FIG. 2 is an end view of the rotating rectifier module of FIG. 1.
Figure 3:
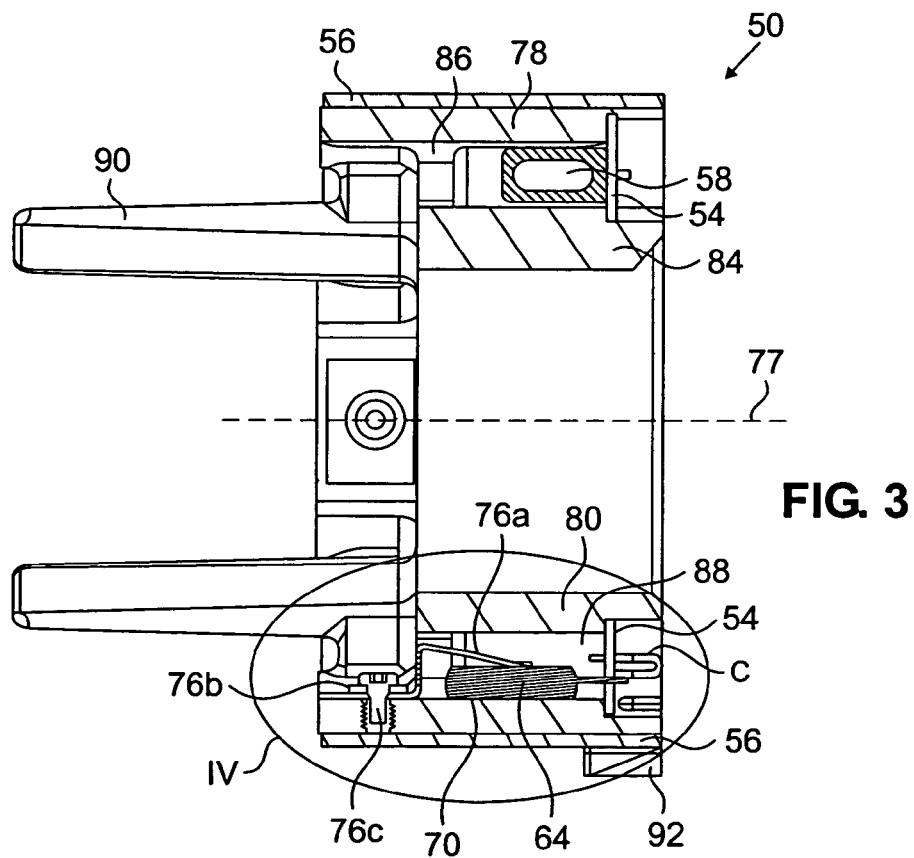
FIG. 3 is a sectional view taken along line III-III of FIG. 2.
Figure 4:
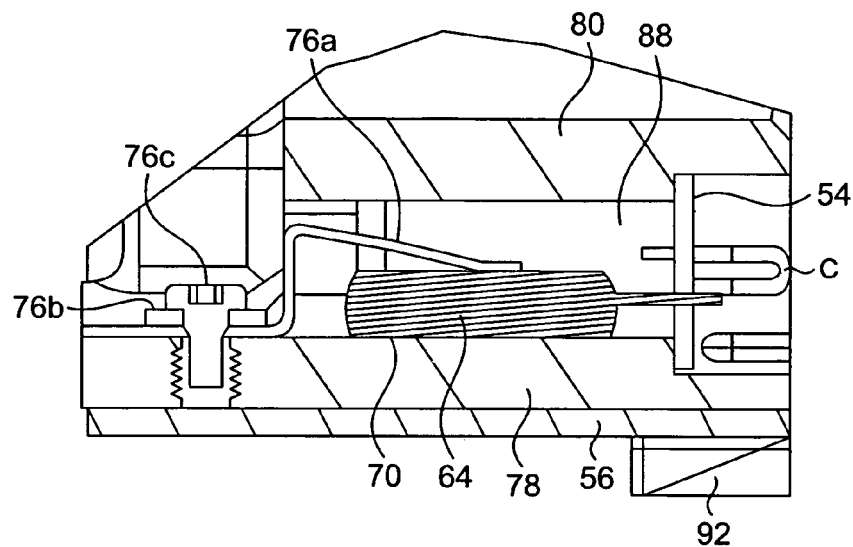
FIG. 4 is an enlarged view of section IV of FIG. 3.
Figure 5:
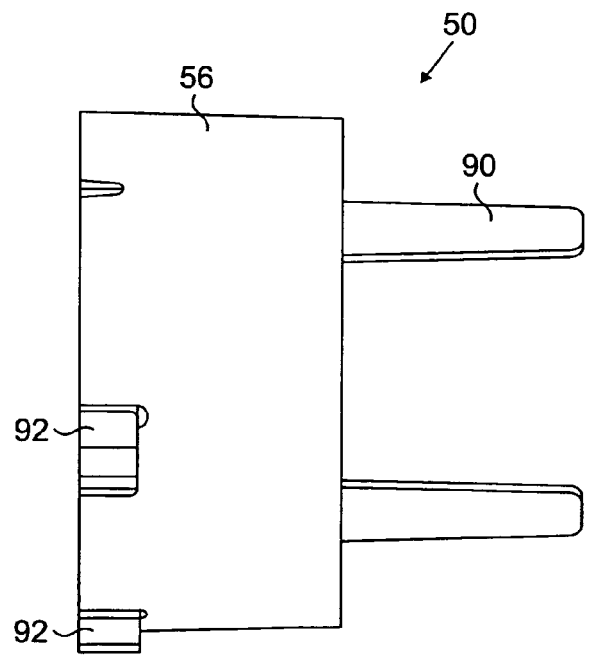
FIG. 5 is a side view of the rotating rectifier module of FIG. 1.

FIGS. 1-5 illustrate rotating rectifier module 50 in accord with the present invention for housing a rectifier circuit for use on rotating elements of electrical machinery. In particular, FIG. 1 is an exploded perspective view of rotating rectifier module 50; FIG. 2 is an end view of rotating rectifier module 50; FIG. 3 is a sectional view taken along line III-III of FIG. 2; FIG. 4 is an enlarged view of section IV of FIG. 3; and FIG. 5 is a side view of rotating rectifier module 50.

Rotating rectifier module 50 is a low-cost, integral structure for use on rotating elements of electrical machinery, and more particularly, for rectifying an AC voltage signal received from a three-phase AC power supply into a DC voltage signal for supply to a DC load. The rectifier circuit has six diodes arranged in a conventional bridge configuration and a capacitor.

Rotating rectifier module 50 includes housing 52; electrical circuit board 54; glove 56; input terminals A, B, and C; output terminals D and E; capacitor 58; diode rectifier packages 60, 62, and 64; thermal interface pads 66, 68, and 70; and diode mounting hardware 72, 74, and 76. Diode mounting hardware 72 further includes spring clip 72a, washer 72b, and screw 72c; diode mounting hardware 74 and 76 are similarly composed.

Housing 52 is shaped such that the center of gravity of rotating rectifier module 50 resides about central axis 77 thereof. Accordingly, housing 52 is tubular, toroidal, or columnar, in shape. Housing 52 includes outer surface, or wall, 78 and inner surface, or wall, 80. Inner surface 80 defines a central opening 82 in housing 52 for receipt of a rotatable shaft (not shown), on which rotating rectifier module 50 rotates. Inner surface 80 includes key 84 for securing housing 52 to the shaft via a keyway in the shaft. Housing 52 alternatively may be secured in place by various conventional methods. For example, housing 52 may instead be secured to an adjacent component.

Housing 52 includes four cavities, or pockets, between outer surface 78 and inner surface 80 for internal placement of capacitor 58 and diodes 60, 62, and 64. Visible in FIGS. 3 and 4 are cavity 86 for capacitor 58 and cavity 88 for diode rectifier package 64; the remaining two cavities are not visible in the drawings. The cavities are equally spaced about the diameter of the housing, but in alternate embodiments, they may be variably spaced. Further, housing 52 may include fewer or more than four cavities. For instance, a single cavity extending about all or most of the diameter of housing 52 could replace the four cavities of the shown embodiment.

Housing 52 is preferably formed of a thermally conductive material, such as aluminum, which enables housing 52 to act as a heat sink for diode rectifier packages 60, 62, and 64. The large surface area of housing 52 further improves its ability to dissipate heat generated by diode rectifier packages 60, 62, and 64. Additionally, housing 52 has sufficient weight such that the addition of capacitor 58 and diode rectifier packages 60, 62, and 64 does not substantially move the center of gravity of rotating rectifier assembly from central axis 77.

Housing 52 also includes four legs 90 axially extending from a first end of housing 52. Legs 90 may be used to secure rotating rectifier module 50 to an adjacent component along the shaft on which rotating rectifier module 50 rotates. For instance, the adjacent component may include holes therethrough for receipt of legs 90. Such a configuration could allow the adjacent component to act as a heat sink, further improving the performance of rectifier module 50. Legs 90 may also be made to extend beyond the adjacent component, thus working to agitate the air during rotation of rectifier module 50 and further improve heat transfer from diode rectifier packages 60, 62, and 64.

Electrical circuit board 54 is affixed to a second end of housing 52 opposite the first end. In the embodiment of FIGS. 1-5, circuit board 54 is recessed a short distance into housing 52. Input terminals A, B, and C are affixed to circuit board 54 for receipt of the AC input signal from the AC power source. Likewise, output terminals D and E are affixed to circuit board 54 for delivery of the DC output signal to the DC load. As is well known, circuit board 54 includes thereon electrical connections between input terminals A, B, and C; output terminals D and E; capacitor 58; and diode rectifier packages 60, 62, and 64 necessary to form the rectifier circuit of rotating rectifier module 50.

Input terminals A, B, and C are insulation displacement type connectors for receipt of a magnet wire-type wire which forms the coils of the AC power source. Magnet wire is single strand wire commonly used in forming the coils of electromagnetic devices. Alternatively, input terminals may be any type of connector that accepts the magnet wire from the AC power source. Output terminals D and E are terminal-to-terminal type connectors, such as quick disconnect or Faston type connectors, for receipt of complementary connectors on the DC load. The use of these types of connectors avoids the use of "flying leads" common in conventional rotating rectifier assemblies. These types of connectors are less prone to human error during assembly, and are less likely to be weakened by rotational forces than the traditional flying leads.

The terminal-to-terminal type connectors provide several additional advantages. First, alignment of the connectors between rotating rectifier module 50 and the DC load can be better assured by securing both devices to the shaft via appropriate key/keyway combinations on the devices and the shaft. This further minimizes the likelihood for human error during assembly. Second, these terminal-to-terminal type connectors also allow for a more reliable electrical connection than flying leads would allow. The rectifier circuit is sensitive to voltage drops, and by minimizing the number of connections between rotating rectifier module 50 and its DC load minimizes the voltage drop therebetween.

The magnet wire type connectors may further offer the advantage of reducing the number of hand connections required to connect rotating rectifier module 50 to the AC power supply. Often, the AC power supply includes a coil wound with magnet wire. A conventional flying lead is a stranded conductor that requires separate connection to both the magnet wire of the coil and the input terminal of the rectifier assembly. By using magnet wire connectors, the magnet wire of the AC power source can be directly connected to one of input terminals A, B, and C of rotating rectifier module 50, thus eliminating one connection and improving the reliability of module 50.

In one embodiment, diode rectifier packages 60, 62, and 64 are phase-leg diode packages having two diodes connected in series and three terminals for connection across the series combination of the two diodes and to the junction between the two diodes. As described above, diode rectifier packages 60, 62, and 64 are positioned inside the cavities of housing 52. Unlike conventional rotating rectifier assemblies, diode rectifier packages 60, 62, and 64 are mounted on a surface substantially parallel to axis 77 rather than substantially normal to axis 77. More specifically, diode rectifier packages 60, 62, and 64 are mechanically and thermally joined to an outermost surface that defines the respective cavity, such that the centripetal forces caused by the rotation of rectifier module 50 will drive diode rectifier packages 60, 62, and 64 into greater physical contact with housing 52. Thus, unlike the prior art designs which were thermally and electrically weakened by increased centripetal force, the rectifier circuit of rectifier module 50 actually performs better with increased rotational speed.

Diode rectifier packages 60, 62, and 64 are thermally joined with housing 52 via a respective one of thermal interface pads 66, 68, and 70 positioned therebetween. Thermal interface pads 66, 68, and 70 enhance heat transfer by reducing thermal resistance across the interface between diode rectifier packages 60, 62, and 64 and housing 52. Thermal interface pads 66, 68, and 70 also minimize the variance of the interface resistance as compared to just surface-to-surface contact.

Diode rectifier packages 60, 62, and 64 are mechanically joined with housing 52 through use of diode connection hardware 72, 74, and 76. As best shown in FIG. 4, diode rectifier package 64 is secured to outer surface 78 of housing 52 with spring clip 76a, which is in turn held in place by washer 76b and screw 76c screwed into a screw hole in housing 52. Diode rectifier packages 60 and 62 are similarly joined to housing 52. In alternative embodiments, other types of fastening hardware may be used to secure diode rectifier packages 60, 62, and 64 to housing 52.

Glove 56 envelops outer surface 78 of housing 52. Glove 56 is preferably formed of an insulating material, such as plastic, to insulate housing 52. This insulating function is especially important where rotating rectifier module 50 is connected to the AC power supply via legs 90 of housing 52. Glove 56 further includes magnet wire clips 92 for securing the magnet wire from the AC power supply to rotating rectifier module 50, thereby reducing any rotational stresses that may otherwise affect the magnet wire connections.

Figure 6:
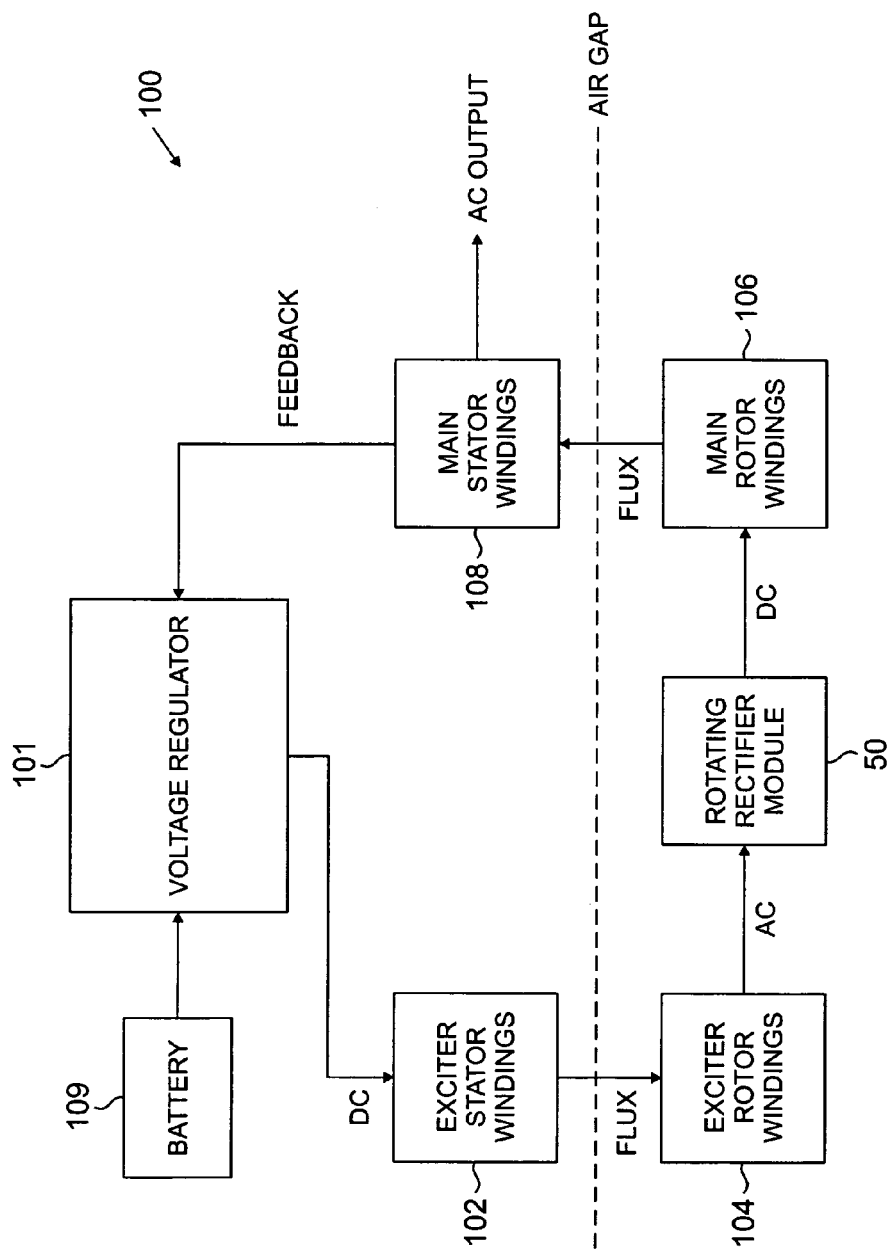
FIG. 6 is a block diagram of a brushless generator including the rotating rectifier module of FIGS. 1-5.

One particular application of rotating rectifier module 50 of the present invention is in a brushless generator such as that illustrated in FIGS. 6-13. FIG. 6 is a block diagram of brushless generator 100 including rotating rectifier module 50 of FIGS. 1-5. Generator 100 further includes voltage regulator 101, an exciter having stator field windings 102 and rotor field windings 104 and a main generator having rotor field windings 106 and stator field windings 108. Exciter rotor field windings 104, rotating rectifier module 50, and main generator field windings 106 share a rotor and are separated by an air gap from the stator having exciter stator field windings 102 and main stator field windings 108.

In operation, voltage regulator 101 receives a DC voltage from DC battery 109. Alternately, DC battery could be replaced with a permanent magnet generator or another source of DC voltage. Voltage regulator 101 supplies a first DC voltage to exciter stator field windings 102, which in turn develop a magnetic field. Exciter rotor field windings 104 are rotated in this magnetic field to produce a first multiphase AC voltage. The first AC voltage is then supplied to rotating rectifier module 50, which rectifies the first AC voltage into a second DC voltage for supply to main generator rotor field windings 106. The current in main generator rotor field windings 106 then generates a magnetic field which in turn induces a second multiphase AC power at the output of main generator stator windings 108. This second AC power is supplied to any loads of generator 100, and also as feedback to voltage regulator 101.

Figure 7:
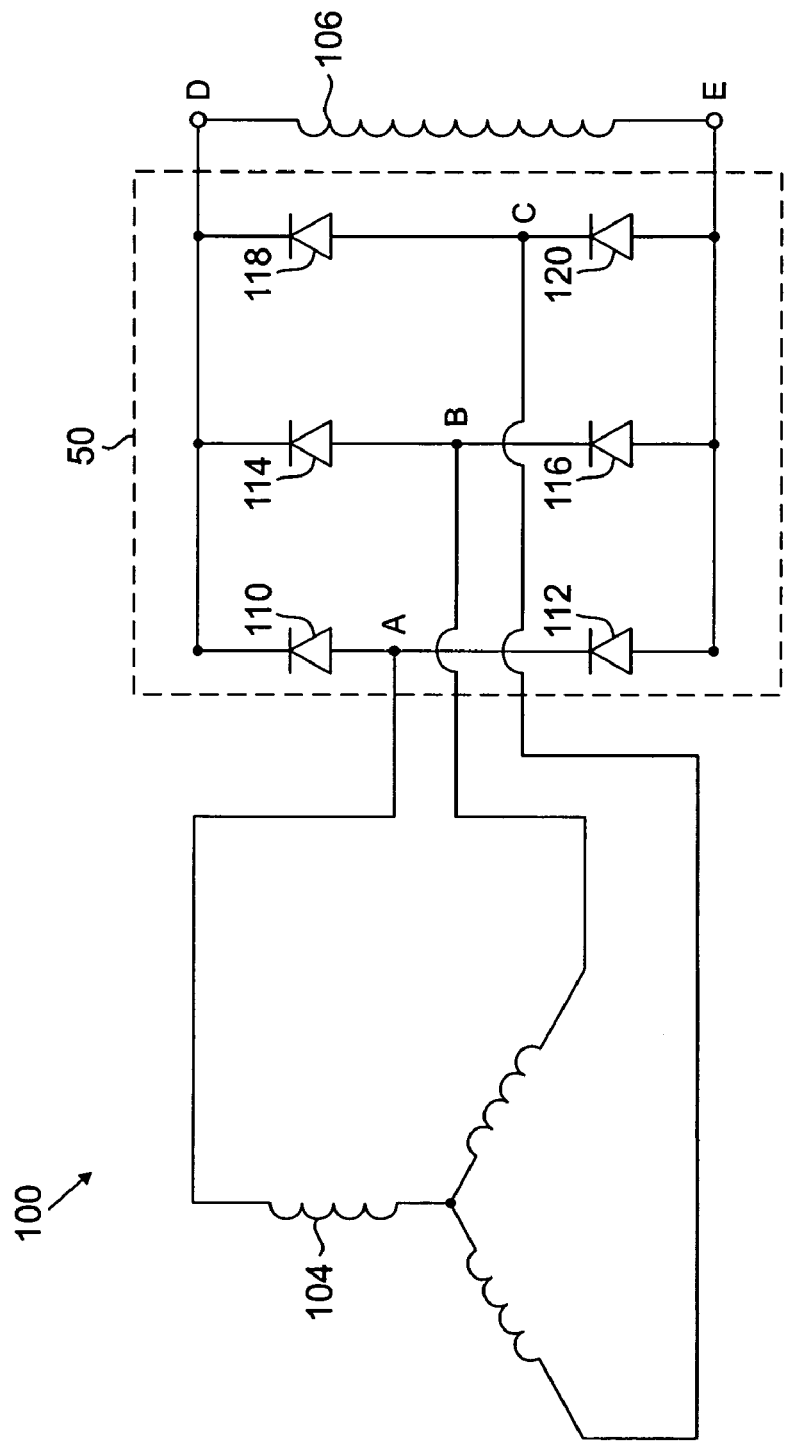
FIG. 7 is a schematic drawing of a rotor portion of the brushless generator of FIG. 6.

FIG. 7 is a schematic drawing of the rotor portion of brushless generator 100 of FIG. 6. In this example, exciter rotor field windings 104 are configured to have three phases for generating a three-phase (AC) voltage which is supplied to input terminals A, B, and C of rectifier assembly 50. The rectifier circuit of rotating rectifier assembly 50 includes diodes 110, 112, 114, 116, 118, and 120 connected in a bridge configuration to input terminals A, B, and C to rectify the AC voltage into a DC voltage across output terminals D and E. Rectifier circuits formed of pairs of diodes 110/112, 114/116, and 118/120 between output terminals D and E each connect to one phase of exciter rotor field winding 104. For example, diodes 110 and 112 in series with one another form a rectifier circuit (such as one of diode rectifier assemblies 60, 62, and 62 of FIGS. 1-5). Diode 110 has its anode connected to input terminal A and its cathode connected to output terminal D. Diode 112 has its anode connected to output terminal E and its cathode connected to output terminal A. Main rotor field winding 106 is electrically connected between output terminals D and E for receipt of the DC voltage.

Figure 8:
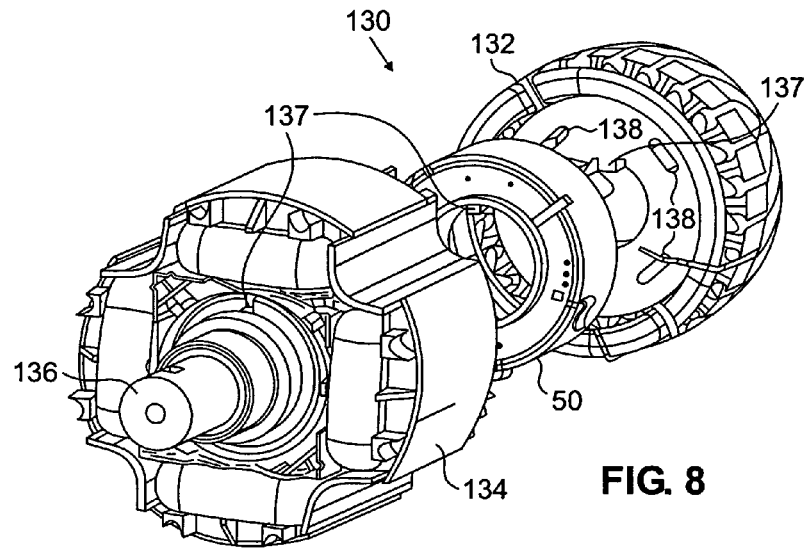
FIG. 8 is an exploded perspective view of a rotor portion of an exemplary generator that includes an exciter, the rotating rectifier module of the present invention, and a main generator.
Figure 9:
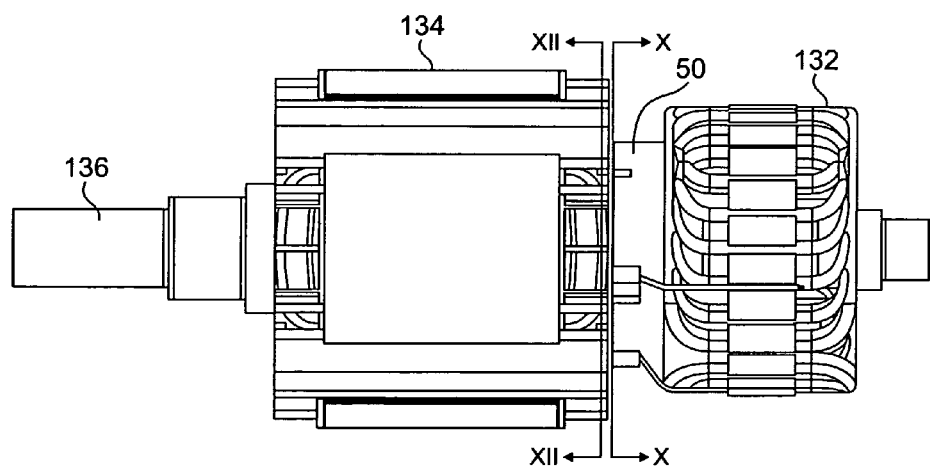
FIG. 9 is a side view of the rotor portion of the generator of FIG. 8.
Figure 10:
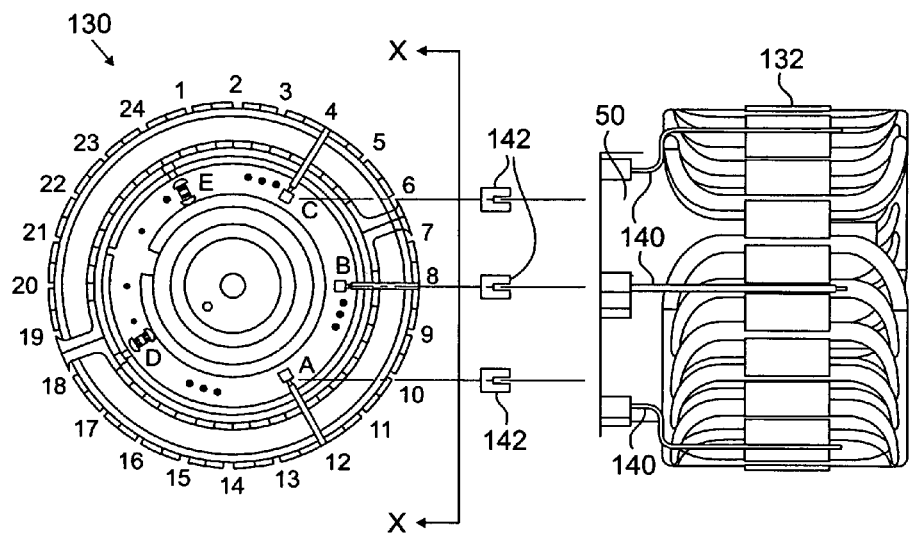
FIG. 10 combines a sectional view of the rotating rectifier module taken along line X-X of FIG. 9 and a side view of the rotor portion of the exciter for illustrating electrical connection therebetween.
Figure 11:
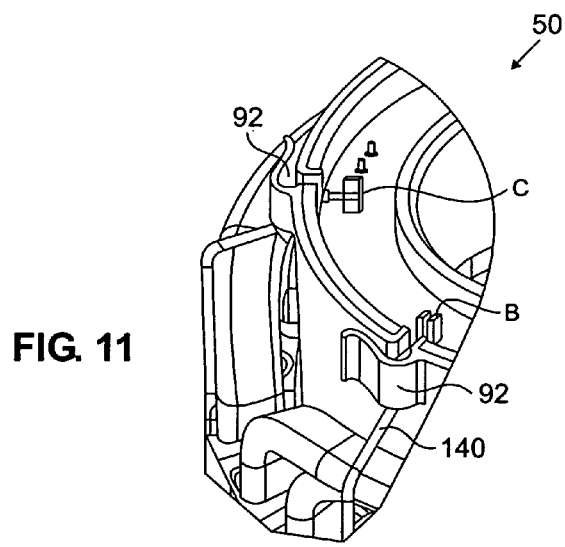
FIG. 11 is a partial perspective view of the rotating rectifier module of FIG. 8 illustrating its electrical connection to the rotor portion of the exciter.
Figure 12:
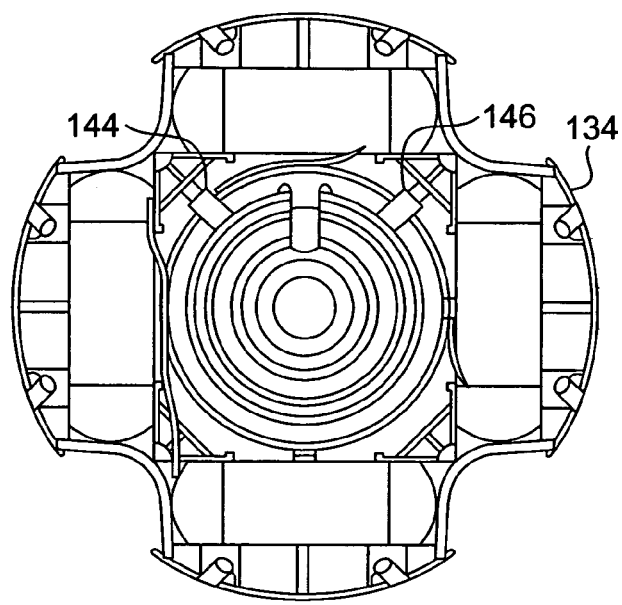
FIG. 12 is a sectional view taken along line XII-XII of FIG. 9.
Figure 13:
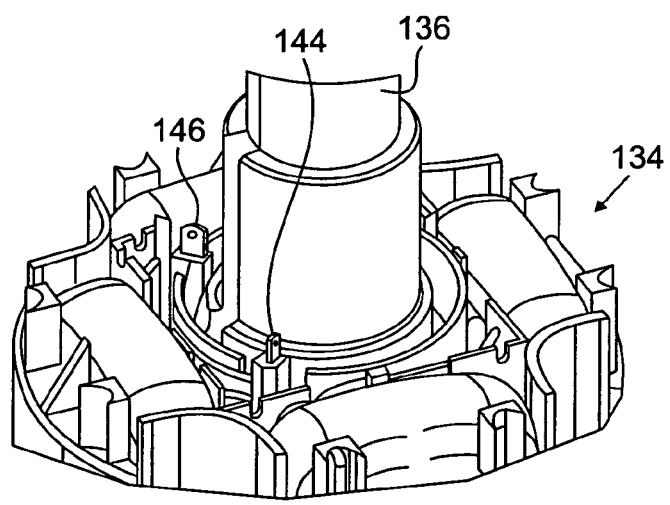
FIG. 13 is a partial perspective view of the rotor portion of the main generator of FIG. 8 illustrating its electrical connection to the rotating rectifier module of FIG. 8.

FIGS. 8-13 illustrate a rotor portion of exemplary generator 130 incorporating rotating rectifier module 50, exciter rotor 132 and main generator rotor 134. In particular, FIG. 8 is an exploded perspective view of the rotor portion of generator 130; FIG. 9 is a side view of the rotor portion of generator 130; FIG. 10 combines a sectional view taken along line X-X of FIG. 9 and a side view of exciter rotor 132 and rotating rectifier module 50 for illustrating electrical connection therebetween; FIG. 11 is a partial perspective view of rotating rectifier module 50 further illustrating its electrical connection to exciter rotor 132; FIG. 12 is a sectional view taken along line XII-XII of FIG. 9; FIG. 13 is a partial perspective view of main generator rotor 134 illustrating its electrical connection to rotating rectifier module 50.

In the context of FIGS. 1-5, exciter rotor 132 is the AC source to rotating rectifier module 50, while main generator rotor 134 is the DC load of rotating rectifier module 50. All three devices are disposed about rotatable shaft 136. Alignment of the three devices is secured via key/keyway combinations 137.

Rotating rectifier module 50 physically connects to exciter rotor 132 via its legs 90 extending through holes 138 of exciter rotor 132. FIGS. 10 and 11 illustrate the electrical connection between exciter rotor 132 and rotating rectifier module 50. Magnet wire 140, which is wrapped about exciter rotor 132 to form the exciter coil, extends from exciter rotor 132 toward rotating rectifier module 50, through magnet wire clips 92, and into input terminals A, B, and C. Magnet wire 140 is then secured to input terminals A, B, and C via input terminal caps 142.

As best seen in FIGS. 12 and 13, main generator rotor 134 electrically connects to rotating rectifier assembly 50 via terminal-to-terminal connections. Main generator rotor 134 includes terminals 144 and 146 for complementary connection to a respective one of terminals D and E of rotating rectifier module 50.

In sum, the present invention offers an integral rotating rectifier module for rectifying a multiphase AC input signal into a DC output signal. The rotating rectifier module improves performance over the prior art by mounting the mass heavy electronics in cavities adjacent an outermost surfaces parallel to the axis of rotation of the module, thereby taking advantage of the centripetal forces to improve thermal and mechanical connection. The rotating rectifier module of the present invention further allows for easy connection to the AC power supply and the DC load by providing connections thereto on a circuit board mounted substantially normal to the axis of rotation. Use of magnet wire and terminal-to-terminal type connectors further improves the performance of the novel rotating rectifier module of the present invention. The uniformity of the relatively large housing improves the balance of the rectifier module itself and mitigates any imbalance between the individual electronic components. The relatively large housing can further be balanced by the addition or subtraction of material from the housing, thus minimizing any vibration eccentricities that may otherwise occur at high rotational speeds in an imbalanced structure.

Although the present invention has been described with reference to preferred embodiments, workers skilled in the art will recognize that changes may be made in form and detail without departing from the spirit and scope of the invention.

The invention claimed is:

1. A rotating rectifier module for rectifying a multiphase alternating current provided by a multiphase alternating current power supply, the rotating rectifier module comprising:
a housing having an outer surface, an inner surface defining a central opening for receipt of a rotatable shaft, and at least one cavity located between the outer and inner surfaces, each cavity being defined in the housing by an outermost and an innermost surface;
a circuit board mounted at an end of the housing and having a first side facing away from the housing and a second side facing toward an interior of the housing, each side defining a plane substantially normal to an axis of rotation of the rotating rectifier module;

a plurality of input terminals located on the first side of the circuit board, each input terminal being electrically connectable to one phase of the power supply;

a first output terminal and a second output terminal each located on the first side of the circuit board and being electrically connectable to a direct current load; and a plurality of rectifier circuits electrically connected in parallel between the first and second output terminals, each rectifier circuit being mounted inside one of the at least one cavity on the outermost surface that defines the cavity and being electrically connected to one of the input terminals.

2. The rotating rectifier module of claim 1 wherein the housing is configured as a heat sink for the rectifier circuits.

3. The rotating rectifier module of claim 2 wherein the housing is formed of aluminum.

4. The rotating rectifier module of claim 1 wherein the input terminals are each insulation displacement type connectors.

5. The rotating rectifier module of claim 4 and further comprising a glove disposed about the housing, wherein the glove includes at least one clip for securing a magnet wire-type wire from the alternating current source to the rotating rectifier module.

6. The rotating rectifier module of claim 1 wherein the output terminals are each terminal-to-terminal type connectors.

7. The rotating rectifier module of claim 1 wherein the inner surface of the housing includes a key for securing the housing to the shaft via a keyway in the shaft.

8. The rotating rectifier module of claim 1 wherein the housing is substantially balanced about the rotatable shaft.

9. The rotating rectifier module of claim 1 and further comprising a plurality of fasteners, each fastener for securing one of the rectifier circuits to the housing.

10. The rotating rectifier module of claim 1 and further comprising a plurality of legs extending axially from a first end of the housing.

11. The rotating rectifier module of claim 10 wherein the power supply is coupled to the rotating rectifier module via the legs of the rotating rectifier module which extend through a plurality of holes in the power supply.

12. The rotating rectifier module of claim 1, wherein the housing has a first end and a second end, wherein the circuit board is mounted on the second end of the housing within a recessed area.

* * * * *

UNITED STATES PATENT AND TRADEMARK OFFICE
CERTIFICATE OF CORRECTION

| | | |
|---|---|---|
| PATENT NO. | : 7,511,392 B2 | Page 1 of 1 |
| APPLICATION NO. | : 11/155384 | |
| DATED | : March 31, 2009 | |
| INVENTOR(S) | : Michael Rubbo et al. | |

It is certified that error appears in the above-identified patent and that said Letters Patent is hereby corrected as shown below:

Column 5, Line 58, delete "output terminal A", insert --input terminal A--

Signed and Sealed this

Thirteenth Day of July, 2010

David J. Kappos
*Director of the United States Patent and Trademark Office*